United States Patent
Iwafuchi et al.

(10) Patent No.: US 8,860,878 B2
(45) Date of Patent: Oct. 14, 2014

(54) CAMERA MODULE, AND MANUFACTURING DEVICE AND METHOD FOR THE SAME

(75) Inventors: Toshiaki Iwafuchi, Kanagawa (JP); Toshihiro Furusawa, Gifu (JP); Yoshihito Higashitsutsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 141 days.

(21) Appl. No.: 13/545,499

(22) Filed: Jul. 10, 2012

(65) Prior Publication Data

US 2013/0033639 A1   Feb. 7, 2013

(30) Foreign Application Priority Data

Aug. 1, 2011   (JP) ................... 2011-168024

(51) Int. Cl.
  *H04N 5/225*   (2006.01)
  *H01L 27/146*   (2006.01)
(52) U.S. Cl.
  CPC .... *H01L 27/14618* (2013.01); *H01L 27/14625* (2013.01)
  USPC ............ 348/372; 348/294; 348/335; 348/360
(58) Field of Classification Search
  USPC .................. 348/372, 294, 335, 360
  See application file for complete search history.

(56) References Cited

U.S. PATENT DOCUMENTS

| | | | | |
|---|---|---|---|---|
| 2004/0262645 | A1* | 12/2004 | Huff et al. | 257/232 |
| 2006/0056084 | A1* | 3/2006 | Araki | 359/823 |
| 2008/0122967 | A1* | 5/2008 | Huang | 348/340 |
| 2010/0084726 | A1* | 4/2010 | Lee et al. | 257/432 |
| 2010/0117176 | A1* | 5/2010 | Uekawa | 257/432 |
| 2010/0208132 | A1* | 8/2010 | Shiraishi | 348/374 |
| 2010/0231766 | A1* | 9/2010 | Moriya et al. | 348/294 |
| 2011/0013063 | A1* | 1/2011 | Yamamoto et al. | 348/294 |
| 2011/0026148 | A1* | 2/2011 | Tanimura et al. | 359/823 |
| 2012/0068291 | A1* | 3/2012 | Kawasaki et al. | 257/432 |

FOREIGN PATENT DOCUMENTS

JP   2003-116066   4/2003

* cited by examiner

*Primary Examiner* — Nicholas Giles
*Assistant Examiner* — Abdelaaziz Tissire
(74) *Attorney, Agent, or Firm* — Oblon, Spivak, McClelland, Maier & Neustadt, L.L.P.

(57) ABSTRACT

A camera module includes an imaging sensor, a power feed electrode, a first conductive member, and a first sealing member. The imaging sensor includes a light-receiving surface receiving light gathered by a lens. The power feed electrode is formed to a surface including the light receiving-surface of the imaging sensor, and the power feed electrode is configured to make a power feed. The first conductive member is configured to electrically connect the power feed electrode and a drive electrode. The drive electrode is provided to a drive section configured to drive the lens in accordance with the power feed. The first sealing member is formed by sealing the first conductive member.

6 Claims, 11 Drawing Sheets

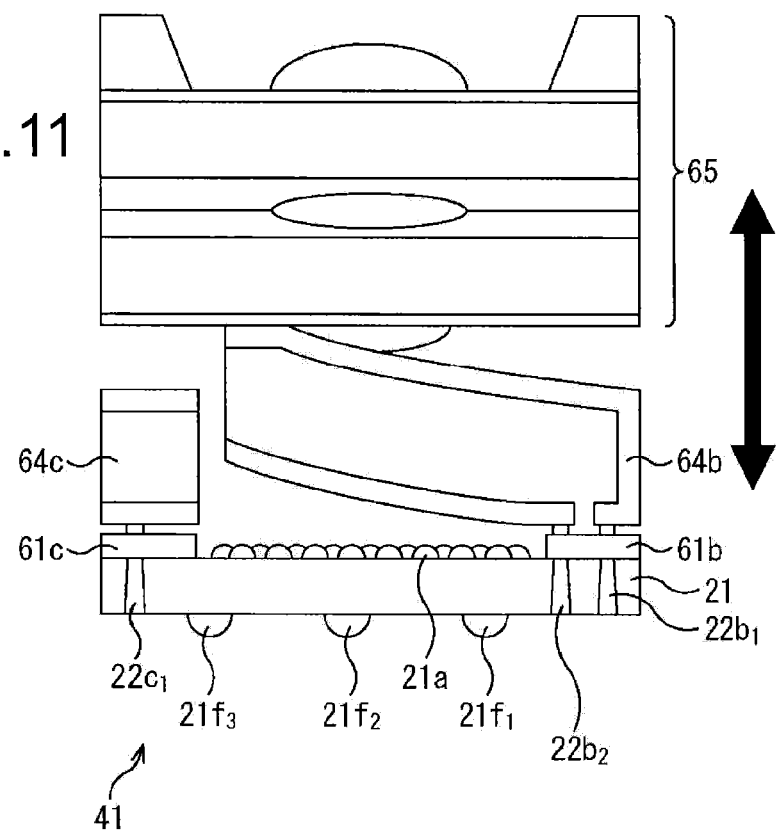
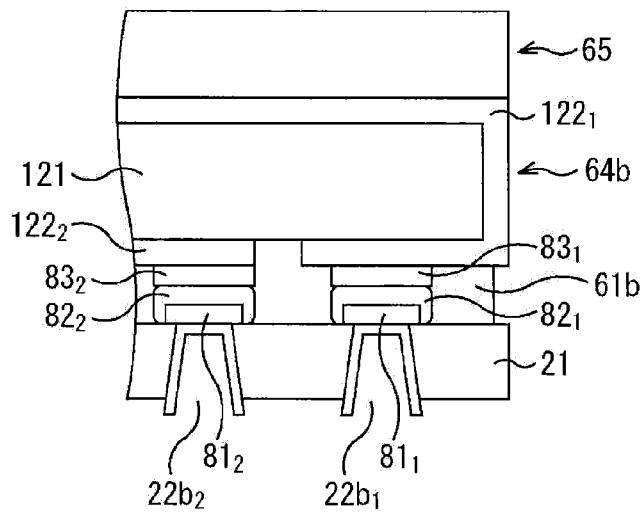

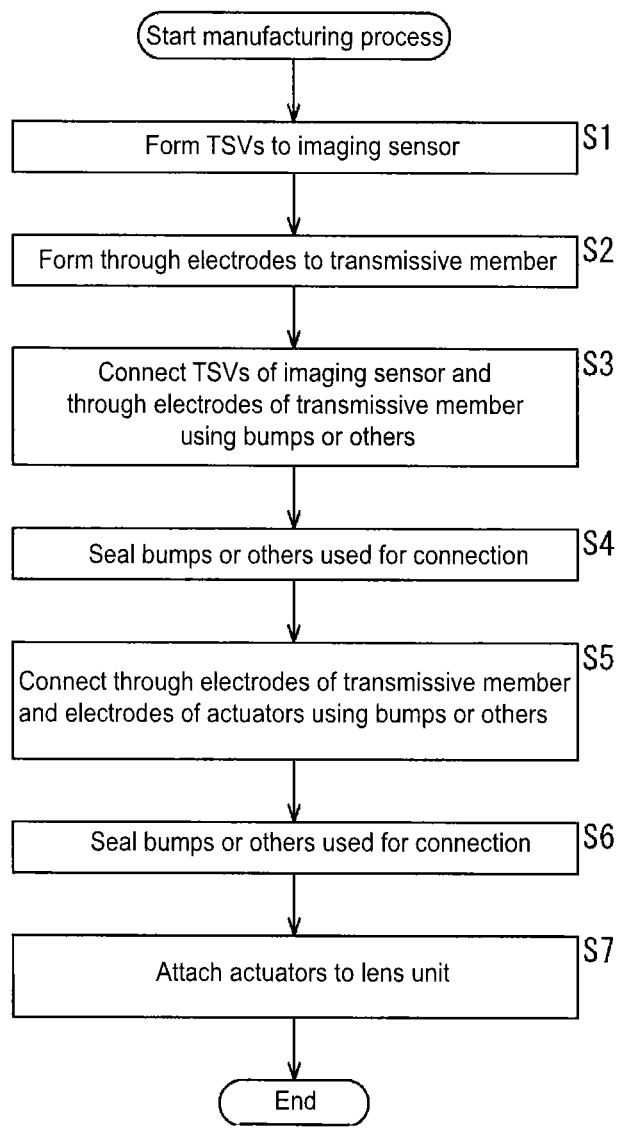

CAMERA MODULE, AND MANUFACTURING DEVICE AND METHOD FOR THE SAME

BACKGROUND

The present disclosure relates to a camera module, and a manufacturing device and method for the camera module, and more specifically, to a camera module capable of exerting control over driving of a lens, and a manufacturing device and method for the camera module.

There is a sensor module with TSVs (through-silicon vias), for example. As an example, see Japanese Patent Application Laid-open No. 2003-116066.

FIG. 1 shows an exemplary sensor module 1 with TSVs.

This sensor module 1 is configured to include an imaging sensor 21, TSVs (through-silicon vias) 22a and 22b, attachment sections 23a and 23b, and a transmissive member 24. The imaging sensor 21 is provided with imaging elements (light-receiving surface) 21a. The TSVs 22a and 22b are both formed to the imaging sensor 21. The attachment sections 23a and 23b are provided on the imaging sensor 21, and the transmissive member 24 is attached onto the imaging sensor 21 via the attachment sections 23a and 23b.

The TSVs 22a and 22b are through electrodes connected to a motherboard, and go through the imaging sensor 21 for connection with the imaging elements 21a or others thereon. Such TSVs 22a and 22b are used to make supply of power from the motherboard to the imaging elements 21a, and for supply of image signals from the imaging elements 21a to the motherboard.

SUMMARY

In such a sensor module 1, if a lens unit including a plurality of lenses is mounted on the transmissive member 24, a fixed-focus camera module may be configured thereby.

Also in the sensor module 1, if the lens unit is configured to be driven by an electrical connection between the TSVs 22a and 22b and an actuator that operates to drive the lens unit, the resulting camera module becomes capable of autofocus to set the focus automatically, and image stabilization to optically reduce camera shake.

The issue here is that, however, since the sensor module 1 includes the transmissive member 24 on the imaging sensor 21, this prevents a connection between the TSVs 22a and 22b below the transmissive member 24 and the actuator above the transmissive member 24.

It is thus desirable to enable a camera module to exert control over driving of a lens.

A camera module according to a first embodiment of the present disclosure includes an imaging sensor, a power feed electrode, a first conductive member, and a first sealing member. The imaging sensor includes a light-receiving surface receiving light gathered by a lens. The power feed electrode is formed to a surface including the light receiving-surface of the imaging sensor. The power feed electrode is configured to make a power feed. The first conductive member is configured to electrically connect the power feed electrode and a drive electrode. The drive electrode is provided to a drive section configured to drive the lens in accordance with the power feed. The first sealing member is formed by sealing the first conductive member.

The camera module according to the first embodiment may further include a transmissive member provided on the imaging sensor to cover the light-receiving surface. In the camera module, the first conductive member is configured to go through the transmissive member to electrically connect together the power feed electrode and the drive electrode.

The camera module according to the first embodiment may further include a second conductive member provided on a rear surface of the surface including the light-receiving surface of the imaging sensor. In the camera module, the power feed electrode is electrically connected also to the second conductive member by going through the imaging sensor.

The camera module according to the first embodiment may further include a through electrode formed to go through the drive section, the through electrode being connected to the drive electrode. In the camera module, the first conductive member connects together the power feed electrode and the drive electrode via the through electrode.

According to the first embodiment of the present disclosure, in the imaging sensor including the light-receiving surface for receiving light gathered by the lens, the power feed electrode is provided on the surface including the light-receiving surface for a power feed. The power feed electrode is electrically connected with the drive electrode, which is provided to the drive section that drives the lens in accordance with the power feed. The electrical connection is established by the first conductive member, and this first conductive member is sealed by the first sealing member.

A manufacturing device according to a second embodiment of the present disclosure includes a formation section, a connection section, and a sealing section. The formation section is configured to form a power feed electrode to a surface including a light-receiving surface of an imaging sensor for a power feed. The light-receiving surface receives light gathered by a lens. The connection section is configured to connect, by a first conductive member, the power feed electrode and a drive electrode. The drive electrode is provided to a drive section configured to drive the lens in accordance with the power feed. The sealing section is configured to seal the first conductive member.

A manufacturing method according to the second embodiment of the present disclosure is for the manufacturing device that manufactures a camera module, and the method includes a formation step, a connection step, and a sealing step for execution by the manufacturing device. In the formation step, a power feed electrode is formed to a surface including a light-receiving surface of an imaging sensor for a power feed. The light-receiving surface receives light gathered by a lens. In the connection step, by a first conductive member, the power feed electrode is connected with a drive electrode. The drive electrode is provided to a drive section configured to drive the lens in accordance with the power feed. In the sealing step, the first conductive member is sealed.

According to the second embodiment of the present disclosure, in the imaging sensor including the light-receiving surface for receiving light gathered by the lens, the power feed electrode is provided on the surface including the light-receiving surface for a power feed. The power feed electrode is connected with the drive electrode, which is provided to the drive section that drives the lens in accordance with the power feed. The connection is established by the first conductive member, and this first conductive member is sealed.

According to the first embodiment of the present disclosure, the camera module is capable of exerting control over driving of the lens.

According to the second embodiment of the present disclosure, the camera module capable of exerting control over driving of the lens is manufactured.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 11 is a cross-sectional diagram showing another exemplary configuration of the camera module;

FIG. 12 is still another diagram showing a specific exemplary configuration of the components including the TSVs, and the sealing member to the actuator;

FIG. 18 is a flowchart of a manufacturing process for manufacturing the camera module.

DETAILED DESCRIPTION OF EMBODIMENT

Hereinafter, an embodiment of the present disclosure will be described with reference to the drawings.
[Exemplary Configuration of Camera Module 41]

Figure 2:
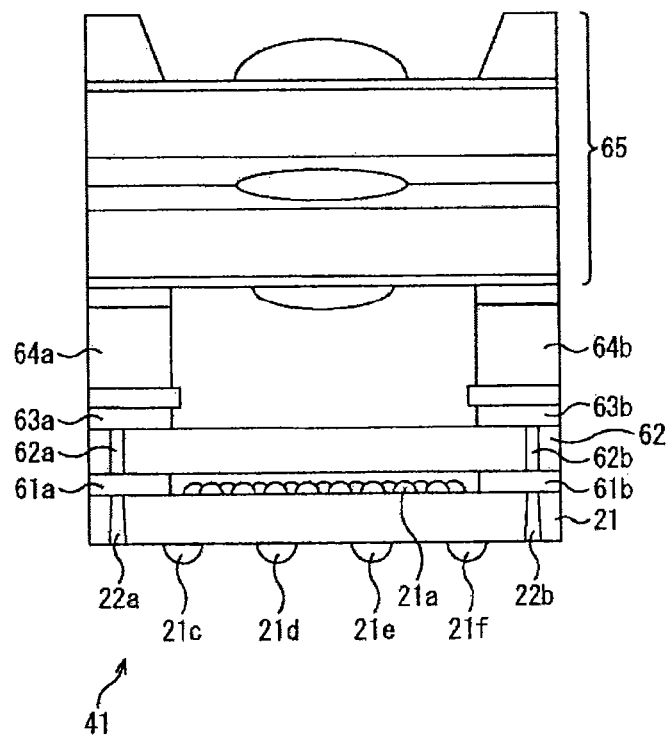
FIG. 2 is a cross-sectional view of a camera module in an embodiment.

FIG. 2 shows an exemplary configuration of a camera module 41 in the embodiment.

Figure 1:
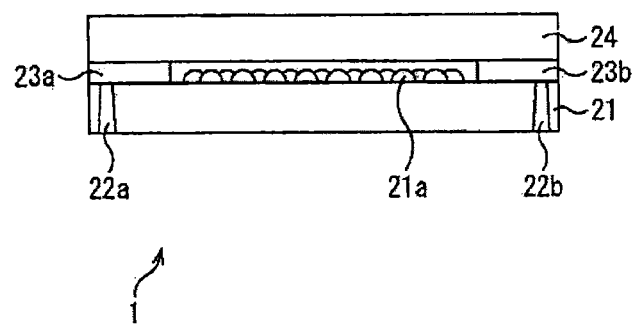
FIG. 1 is a diagram showing an exemplary sensor module with TSVs.

FIG. 2 is a cross-sectional view of the camera module 41 when it is viewed from the side. In FIG. 2, any component configured similarly to that of FIG. 1 is provided with the same reference numeral.

That is, the camera module 41 is configured to include sealing members 61a and 61b, a transmissive member 62 through which through electrodes 62a and 62b are passing, sealing members 63a and 63b, actuators 64a and 64b, and a lens unit 65 in addition to the imaging sensor 21 provided with the imaging elements (light-receiving surface) 21a, and the TSVs 22a and 22b both formed to go through the imaging sensor 21.

Herein, this camera module 41 is a reflowable camera module that is directly mounted on the motherboard.

As such, in FIG. 2, the imaging sensor 21 is formed on the underside (the lower surface in the drawing) with hemispherical soldering sections 21c to 21f for connection of the imaging sensor 21 directly onto the motherboard.

Herein, the TSVs 22a and 22b are connected to the soldering sections 21c to 21f. These TSVs 22a and 22b are through electrodes formed by being connected to the motherboard via the soldering sections 21c to 21f, and going through the imaging sensor 21. In FIG. 2, the TSVs 22a and 22b are used to make supply of power from the motherboard to the actuators 64a and 64b, respectively. Also in FIG. 2, although not shown, the camera module 41 also includes another TSV that is connected to the motherboard via the soldering sections 21c to 21f, and then is connected to the imaging elements 21a by going through the imaging sensor 21. This TSV is used to make supply of power from the motherboard to the imaging elements 21a, or to make supply of image signals from the imaging elements 21a to the motherboard. The TSVs formed to the imaging sensor 21 will be described in detail later by referring to FIG. 5 or others.

As is reflowable, the camera module 41 may be mounted to the motherboard without using a socket or an FPC (Flexible Printed Circuits). This may accordingly lead to the reduction of cost by the socket or the FPC.

The sealing member 61a is provided between the imaging sensor 21 and the transmissive member 62, and is made of resin or others for sealing of electrodes or others, which are for establishing a connection between the TSV 22a and the through electrode 62a.

Similarly, the sealing member 61b is provided between the imaging sensor 21 and the transmissive member 62, and is made of resin or others for sealing of electrodes or others, which are for establishing a connection between the TSV 22b and the through electrode 62b.

The transmissive member 62 is attached onto the imaging sensor 21 via the sealing members 61a and 61b so as to cover the imaging elements 21a. The transmissive member 62 is made of light-transmitting glass or others, and is formed with the through electrodes 62a and 62b passing therethrough.

In the camera module 41, the transmissive member 62 is formed with the through electrodes 62a and 62b. This allows designing of a power supply area in the direction of the normal to the imaging sensor 21, i.e., upward in the diagram, for supply of power (power feeding) to the actuators 64a and 64b.

With such designing, the camera module 41 may be favorably reduced in size in comparison with the designing of a power supply area to be away from the transmissive member 62, for example.

The sealing member 63a is provided between the transmissive member 62 and the actuator 64a, and is made of resin or others for sealing of electrodes or others, which are for establishing a connection between the through electrode 62a formed to the transmissive member 62 and the electrode of the actuator 64a.

Similarly, the sealing member 63b is provided between the transmissive member 62 and the actuator 64b, and is made of resin or others for sealing of electrodes or others, which are for establishing a connection between the through electrode 62b formed to the transmissive member 62 and the electrode of the actuator 64b.

The actuator 64a is attached onto the transmissive member 62 via the sealing member 63a, and supports the lens unit 65. The actuator 64a is driven by power coming from the TSV 22a via the electrodes, i.e., the electrode sealed by the sealing member 61a, the through electrode 62a, and the electrode sealed by the sealing member 63a.

Similarly, the actuator 64b is attached onto the transmissive member 62 via the sealing member 63b, and supports the lens unit 65. The actuator 64b is driven by power coming from the TSV 22b via the electrodes, i.e., the electrode sealed by the sealing member 61b, the through electrode 62b, and the electrode sealed by the sealing member 63b.

The lens unit 65 is supported by the actuators 64a and 64b, and is configured by a plurality of lenses that gather light from the outside.

The camera module 41 is described more in detail below by referring to FIG. 8, which is the cross-sectional view of the camera module 41 when it is viewed from the direction different from that in FIG. 2.

[Specific Exemplary Configuration of Components Including TSV 22b, and Sealing Member 61b to Actuator 64b]

Figure 3:
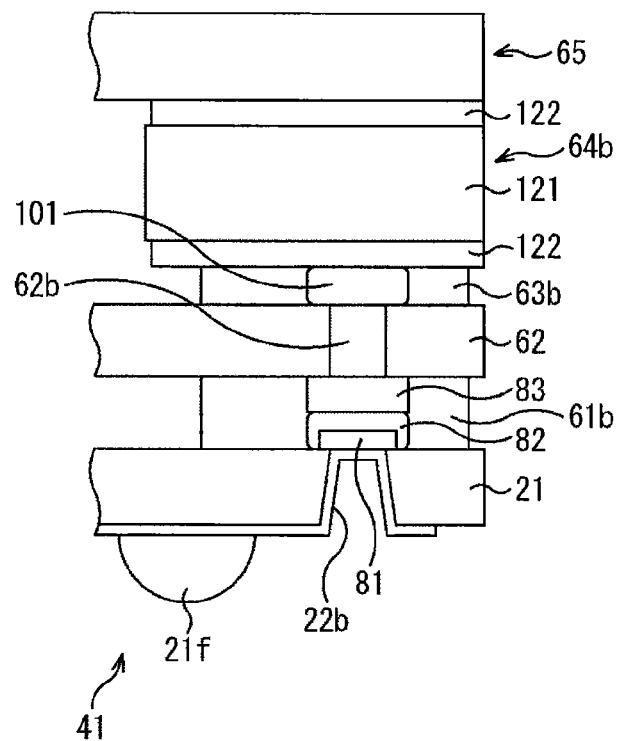
FIG. 3 is a diagram showing a specific exemplary configuration of components including the TSV, and a sealing member to an actuator.

FIG. 3 shows a specific exemplary configuration of the components including the TSV 22b, and the sealing member 61b to the actuator 64b.

The TSV 22b is attached to the underside (the lower surface in the drawing) of the imaging sensor 21, and is connected with the soldering section 21f or others. The TSV 22b is connected to an electrode 81 on the imaging sensor 21 by going therethrough. Herein, for establishing an electrical connection between the soldering section 21f or others and the electrode 81, the TSV 22b in use is shaped as shown in FIG. 3. The shape of the TSV 22b is surely not restricted to the shape of FIG. 3, and may be in any other shapes as long as an electrical connection is established thereby between the soldering section 21f or others and the electrode 81.

The electrode 81 is connected, via conductive bumps 82 and 83, to the through electrode 62b formed to the transmissive member 62. These components, i.e., the electrode 81, and the bumps 82 and 83, are sealed by the sealing member 61b.

A bump 101 is connected to the through electrode 62b formed to the transmissive member 62, and is connected to a sheet-like electrode 122 provided to the actuator 64b. The bump 101 is sealed by the sealing member 63b. The sheet-like electrode 122 is made of carbon, for example.

The actuator 64b is configured by a shape-change section 121, the sheet-like electrode 122, and others. The shape-change section 121 changes in shape in accordance with a current and voltage to be applied to the sheet-like electrode 122. With the shape change as such, the lens unit 65 is driven (changed in shape). The sheet-like electrode 122 is attached to the surface of the shape-change section 121.

The components, i.e., the TSV 22b, and the sealing member 61b to the actuator 64b, are described more in detail below by referring to FIG. 9, which is the cross-sectional view of the components when they are viewed from the direction different from that in FIG. 3.

[Details about Imaging Sensor 21]

Figure 4:
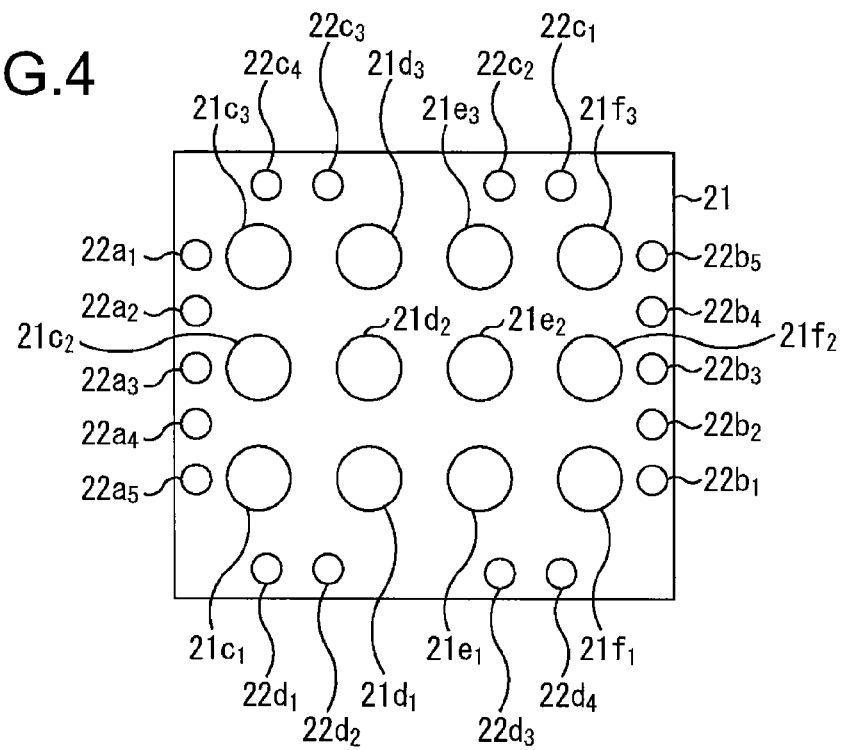
FIG. 4 is a diagram showing an exemplary underside of an imaging sensor.

Next, FIG. 4 shows an exemplary underside of the imaging sensor 21 of FIG. 2.

As shown in FIG. 4, on the underside of the imaging sensor 21, soldering sections $21c_1$ to $21c_3$, $21d_1$ to $21d_3$, $21e_1$ to $21e_3$, and $21f_1$ to $21f_3$ are provided at the center portion thereof.

Moreover, on the underside of the imaging sensor 21, TSV $22a_1$ to $22a_5$ are provided on the left end portion thereof, TSV $22b_1$ to $22b_5$ are provided on the right end portion thereof, TSV $22c_1$ to $22c_4$ are provided on the upper end portion thereof, and TSVs $22d_1$ to $22d_4$ are provided on the lower end portion thereof.

Figure 5:
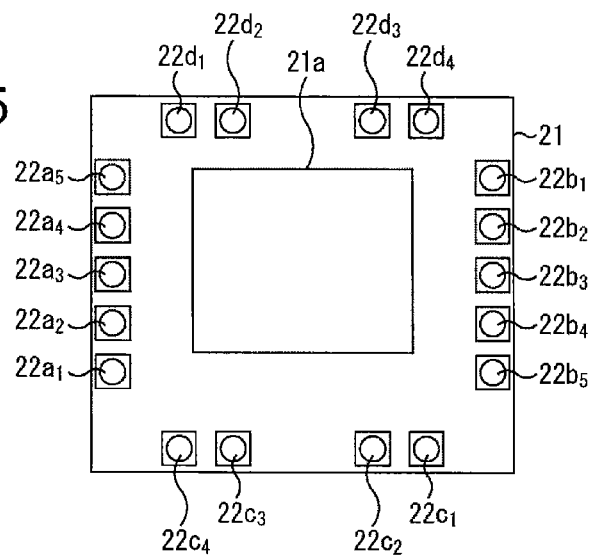
FIG. 5 is a diagram showing an exemplary surface of the imaging sensor.

Next, FIG. 5 shows an exemplary surface of the imaging sensor 21 of FIG. 2.

As shown in FIG. 5, on the surface of the imaging sensor 21, the imaging element 21a is provided to the center portion thereof. Also on the surface of the imaging sensor 21, the TSV $22a_1$ to $22a_5$ are provided on the left end portion thereof, the TSV $22b_1$ to $22b_5$ are provided on the right end portion thereof, the TSV $22c_1$ to $22c_4$ are provided on the lower end portion thereof, and the TSV $22d_1$ to $22d_4$ are provided on the upper end portion thereof. These TSVs are all provided by passing through the surface of the imaging sensor 21.

As to the TSVs $22a_1$ to $22a_5$, the TSVs $22a_1$ and $22a_2$ are used for power feeding to drive the actuator 64a, and as to the TSVs $22b_1$ to $22b_5$, the TSVs $22b_1$ and $22b_2$ are used for power feeding to drive the actuator 64b. Therefore, the TSV 22a of FIG. 2 denotes the TSVs $22a_1$ and $22a_2$ of FIG. 5, and the TSV 22b of FIG. 2 denotes the $22b_1$ and $22b_2$ of FIG. 5.

Moreover, as to the TSVs $22c_1$ to $22c_4$, the TSVs $22c_1$ and $22c_2$ are used for power feeding to drive the actuator 64c that will be described later, and as to the TSVs $22d_1$ to $22d_4$, the TSVs $22d_1$ and $22d_2$ are used for power feeding to drive the actuator 64d that will be described later.

The remaining TSVs, i.e., the TSVs $22a_3$ to $22a_5$, the TSVs $22b_3$ to $22b_5$, the TSVs $22c_3$ and $22c_4$, and the TSVs $22d_3$ and $22d_4$, are used to drive the imaging element 21a, for example. To be more specific, these TSVs, i.e., the TSVs $22a_3$ to $22a_5$, the TSVs $22b_3$ to $22b_5$, the TSVs $22c_3$ and $22c_4$, and the TSVs $22d_3$ and $22d_4$, are in charge of power feeding to the imaging element 21a, and relaying of image signals.

[Details about Transmissive Member 62]

Figure 6:
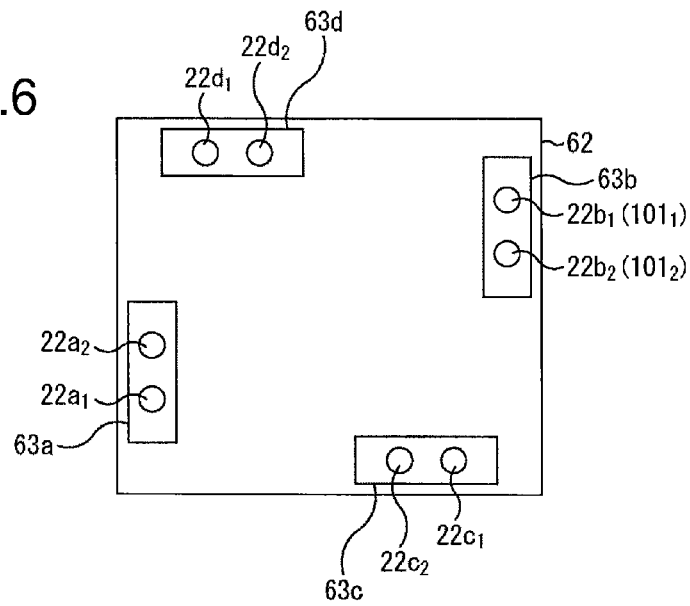
FIG. 6 is a top view of a transmissive member.

FIG. 6 is a top view of the transmissive member 62 disposed on the surface of the imaging sensor 21. As shown in FIG. 6, the transmissive member 62 is provided with the sealing member 63b on the upper right portion thereof. The sealing member 63b seals a bump $101_1$, and the pump $101_1$ is indirectly connected to the TSV $22b_1$. The sealing member 63b seals a pump $101_2$, and the pump $101_2$ is indirectly connected to the TSV $22b_2$.

Herein, the connection is similarly established between the bump $101_1$ and the TSV $22b_1$, and between the bump $101_2$ and the TSV $22b_2$.

Therefore, if the bumps $101_1$ and $101_2$ are simply referred to as the bump 101, and if the TSVs $22b_1$ and $22b_2$ are simply referred to as the TSV 22b, as shown in FIG. 3, the bump 101 is connected to the through electrode 62b formed to the transmissive member 62. Also as shown in FIG. 3, the through electrode 62b is connected to the TSV 22b via the bumps 82 and 83, and the electrode 81, which are sealed by the sealing member 61b.

FIG. 3 is a cross-sectional view of the sealing member 63b of FIG. 6 when it is viewed from the upper side of the drawing.

As shown in FIG. 6, the transmissive member 62 is provided with the sealing member 63a on the lower left portion thereof, the sealing member 63d on the upper left portion thereof, and the sealing member 63c on the lower right portion thereof. These sealing members 63a, 63d, and 63c are each configured similarly to the sealing member 63b, and thus are not described twice.

Figure 7:
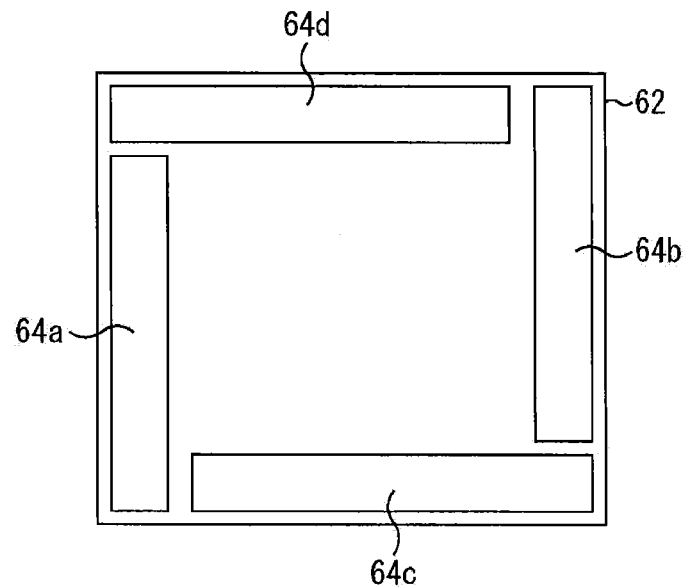
FIG. 7 is a top view of the transmissive member with an attachment of the actuator.

As shown in FIG. 7, the sealing members 63a to 63d on the transmissive member 62 are attached with the actuators 64a to 64d, respectively. By these actuators 64a to 64d, the lens unit 65 is supported.

Figure 8:
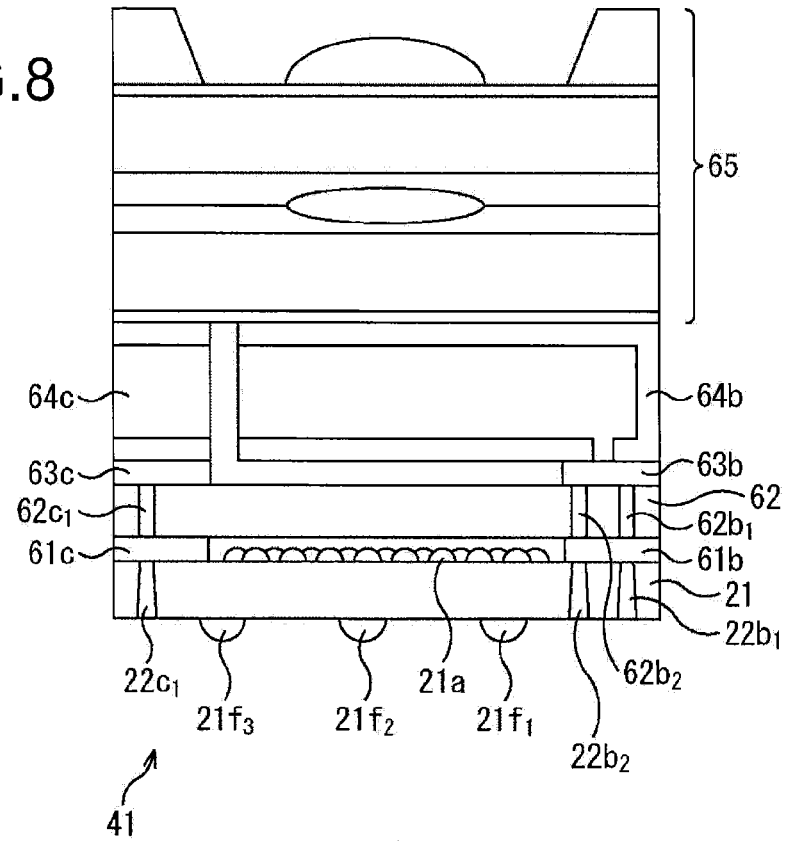
FIG. 8 is another cross-sectional view of the camera module in the embodiment.

Next, FIG. 8 is a cross-sectional view of the camera module 41 of FIG. 6 when it is viewed from the right side of the drawing. Note that FIG. 2 referred to in the above is a cross-sectional view of the camera module 41 of FIG. 6 when it is viewed from the upper side of the drawing.

Figure 9:
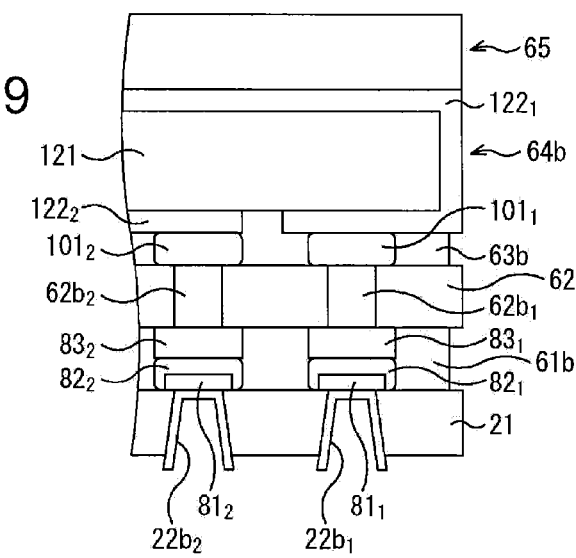
FIG. 9 is another diagram showing a specific exemplary configuration of the components including the TSVs, and the sealing member to the actuator.

Next, FIG. 9 shows specific exemplary configuration of the components of FIG. 8, i.e., the TSVs $22b_1$ and $22b_2$, and the sealing member 61b to the actuator 64b.

The TSVs $22b_1$ and $22b_2$ are each configured as shown in FIG. 3. Note that, in FIG. 9, for a distinction between the TSVs $22b_1$ and $22b_2$, the TSV 22b itself and the corresponding components, i.e., the electrode 81, the bumps 82 and 83, the through electrode 62b, and the bump 101 are each provided with a numerical subscript of 1 or 2.

Also in FIG. 9, the bump $101_1$ is connected to a sheet-like electrode $122_1$ provided to the actuator 64b, and the bump $101_2$ is connected to a sheet-like electrode $122_2$ provided to the actuator 64b.

Figure 10:
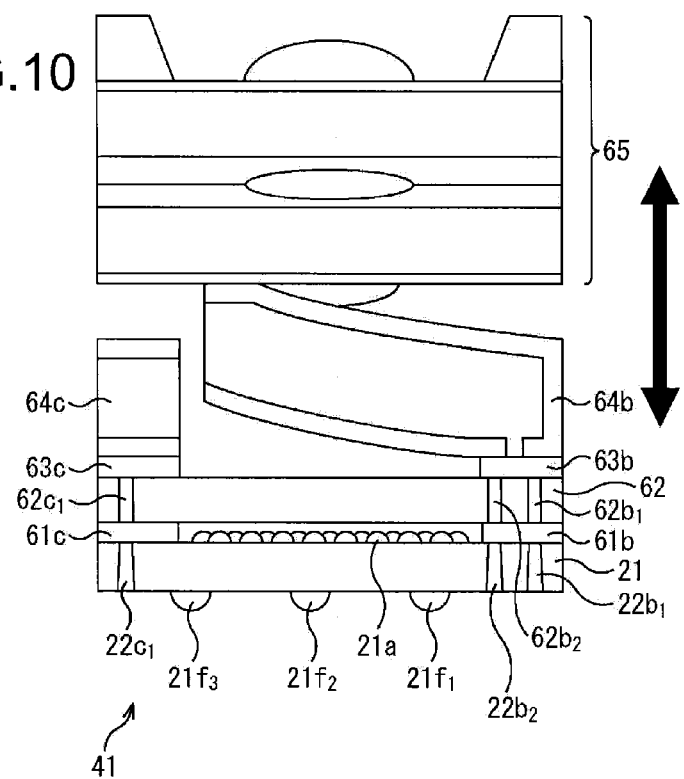
FIG. 10 is a diagram showing an exemplary case of driving a lens unit by changing the shape of the actuator.

In the camera module 41, the actuator 64b, i.e., the shape-change section 121 thereof, is changed in shape as shown in FIG. 10 by application of a current and voltage to the shape-change section 121 via the electrodes $122_1$ and $122_2$. This drives the lens unit 65.

As shown in FIG. 10, in the actuator 64b, only a part of the sheet-like electrode $122_1$ is attached to the lens unit 65. Also as shown in FIG. 10, in the actuator 64b, another part of the sheet-like electrode $122_1$, and a part of the sheet-like electrode $122_2$ are attached to the sealing member 63b.

These are applicable also to the actuators 64a, 64c, and 64d.

Moreover, in the camera module 41, the lens unit 65 is driven (moved) as shown in FIG. 10, for example. The camera module 41 is thus capable of autofocus to set the focus automatically, and image stabilization to optically reduce camera shake.

In this embodiment, the transmissive member 62 is formed with the through electrode 62b for indirectly connecting the TSV 22b to the electrode 122 of the actuator 64b, for example.

Alternatively, as shown in FIG. 11, the transmissive member 62 may not be provided for establishing a connection between the TSV 22b and the electrode 122 of the actuator 64b, for example.

With the configuration not including the transmissive member 62, as shown in FIG. 12, the electrode $122_1$ of the actuator 64b is directly connected with the bump $83_1$ sealed by the sealing member 61b. Moreover, the electrode $122_2$ of the actuator 64 is directly connected with the bump $83_2$ sealed by the sealing member 61b.

As shown in FIGS. 11 and 12, with the configuration not including the transmissive member 62, the camera module 41 is much reduced in height so that the camera module 41 is much reduced in size.

In the camera module 41, the surface of the imaging sensor 21 covered by the imaging elements 21a is formed with a through electrode, and using this through electrode, an electrical connection may be established between the imaging elements 21a and the imaging sensor 21. In this case, the imaging sensor 21 may be favorably reduced in size, i.e., the surface area of the imaging sensor 21 is reduced, in comparison with the case of electrically connecting the imaging elements 21a and the imaging sensor 21 by wire bonding, for example. Accordingly, the camera module 41 may be reduced in size to a further degree. This is applicable also to the camera module 41 of FIGS. 2 to 10, and to the camera module 41 of FIGS. 11 and 12.

Also with the configuration not including the transmissive member 62, light entering the imaging elements 21a of the imaging sensor 21 is not refracted or reflected any more by the transmissive member 62, for example. As such, images to be generated by the imaging elements 21a become free from flares, ghosts, and others so that the images are much increased in quality.

Also in this embodiment, in the actuator 64b, the sheet-like electrode $122_1$ is provided to cover all the way to the lower portion of the shape-change section 121 (to the lower side thereof in the drawing) as shown in FIG. 9 for a connection with the bump $101_1$.

Figure 13:
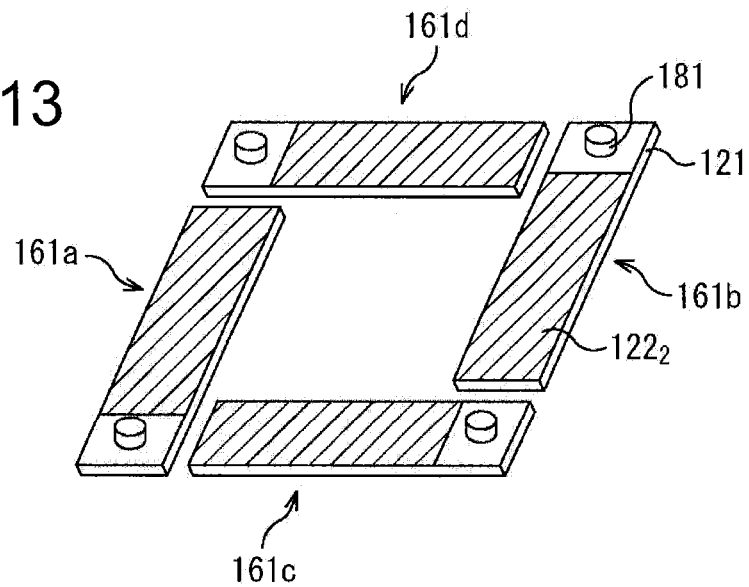
FIG. 13 is a first diagram for illustrating another exemplary configuration of the actuator.
Figure 14:
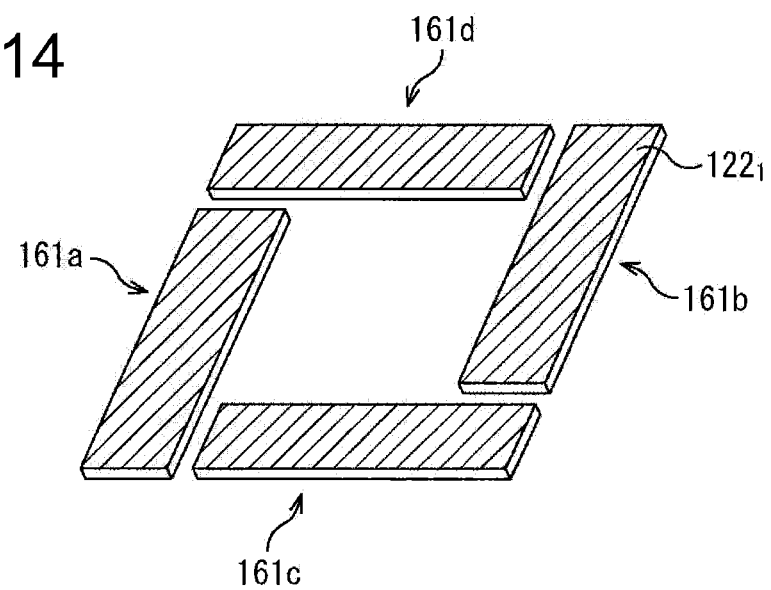
FIG. 14 is a second diagram for illustrating another exemplary configuration of the actuator.

Alternatively, as exemplarily shown in FIGS. 13 and 14, formed may be an actuator 161b in which the shape-change section 121 is provided with a through electrode 181 for a connection with the sheet-like electrode $122_1$ covering the upper portion of the shape-change section 121 (the upper portion thereof in FIG. 9), and the sheet-like electrode $122_1$ is connected to the bump $101_1$ via the through electrode 181. Similarly to such an actuator 161b, actuators 161a, 161c, and 161d are also formed.

Figure 15:
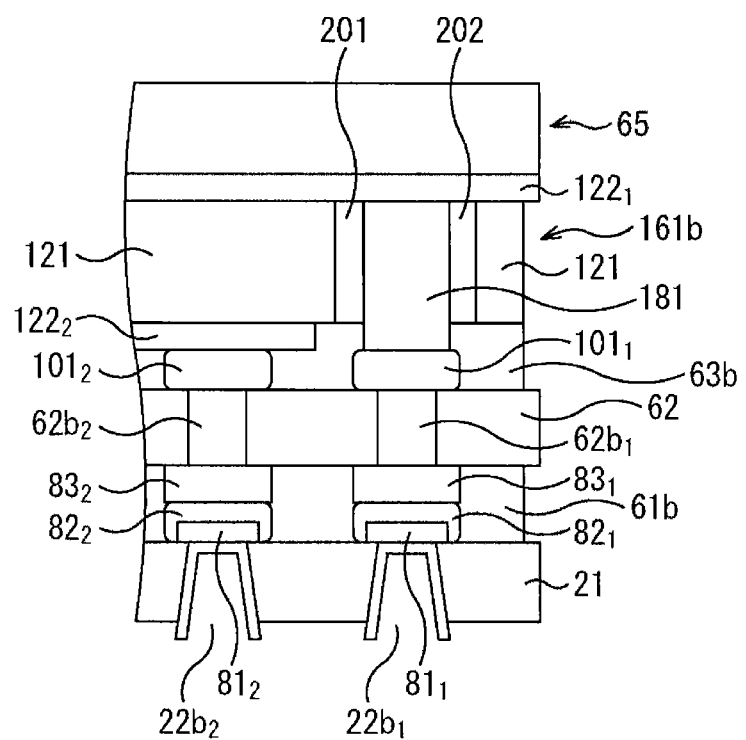
FIG. 15 is a third diagram for illustrating another exemplary configuration of the actuator.

In this case, as shown in FIG. 15, the through electrode 181 is formed by going through the shape-change section 121 while being covered therearound by insulators 201 and 202. One end of the through electrode 181 is connected to the sheet-like electrode $122_1$, and the other end thereof is connected to the bump $101_1$.

When the actuators are formed as shown in FIGS. 13 to 15, the sheet-like electrode $122_1$ is not expected to cover all the way to the lower portion (to the lower side thereof in FIG. 9) of the shape-change section 121. The sheet-like electrode may be instead formed only to both surfaces of the shape-change section 121, i.e., surfaces thereof on the upper and lower sides in FIG. 15, thereby simplifying the process of forming the sheet-like electrode to the shape-change section 121.

Also in this embodiment, as exemplarily shown in FIG. 9, the actuator 62b in use is shaped like a rectangular parallelepiped. This is because such a rectangular-parallelepiped-shaped actuator may be manufactured by relatively simple processing, i.e., a relatively large sheet-like material for an actuator (material including a sheet-like electrode and a shape-change section) is stamped out using a mold or others into the shape of a rectangular parallelepiped. This may accordingly reduce the manufacturing cost of the actuator 62b.

As shown in FIGS. 11 and 12, with the configuration not including the transmissive member 62, the actuators are configured as shown in FIGS. 13 to 15. In this case, the through electrode 181 and the bump $83_1$ are directly connected to each other.

The actuators are not restricted to be shaped like a rectangular parallelepiped. That is, as exemplarily shown in FIG. 16, a semicircular actuator 221b may be also used.

This actuator 221b is configured by a semicircular shape-change section 241, and sheet-like electrodes $242_1$ and $242_2$ covering the side surfaces of the shape-change section 241. In the actuator 221b, in response to application of a current and voltage to the electrodes $242_1$ and $242_2$, the shape-change section 241 changes in shape, thereby driving (moving) the lens unit 65 in the vertical direction.

In this case, the electrode $242_1$ is connected with the bump $101_2$ via an L-shaped electrode 261, and the electrode $242_2$ is connected with the bump $101_1$.

Figure 16:
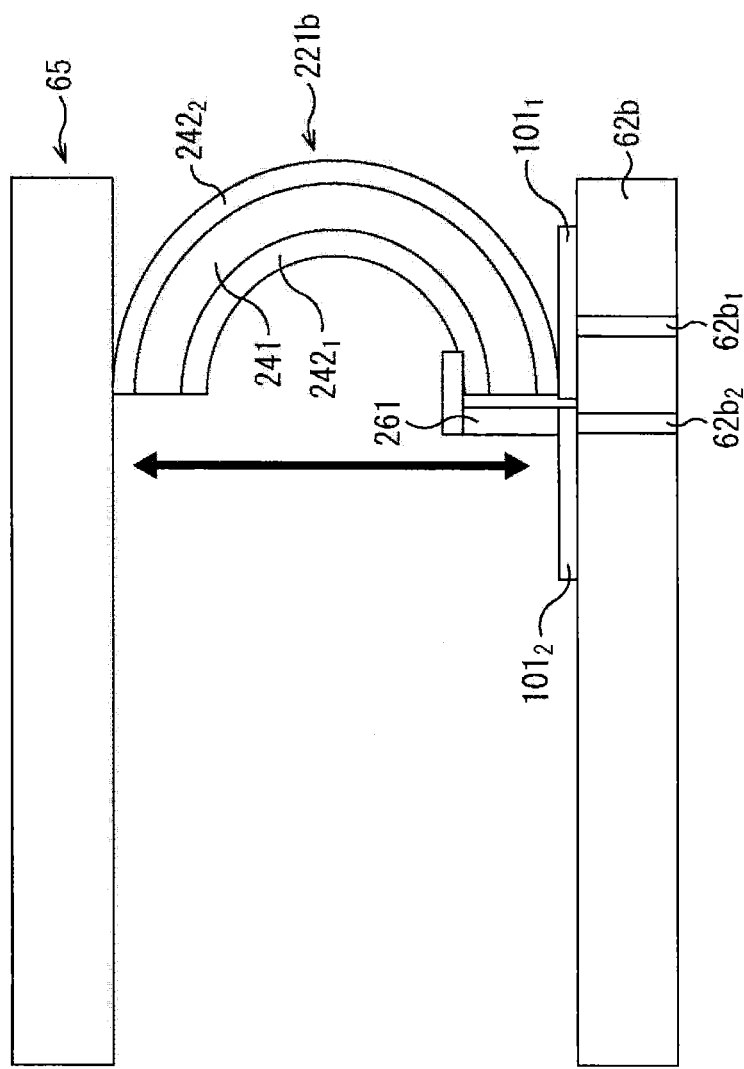
FIG. 16 is a diagram for illustrating still another exemplary configuration of the actuator.

For the sake of brevity, FIG. 16 does not show sealing members or others sealing the bumps $101_1$ and $101_2$.

[Exemplary Configuration of Manufacturing Device 301 for Manufacturing Camera Module 41]

Figure 17:
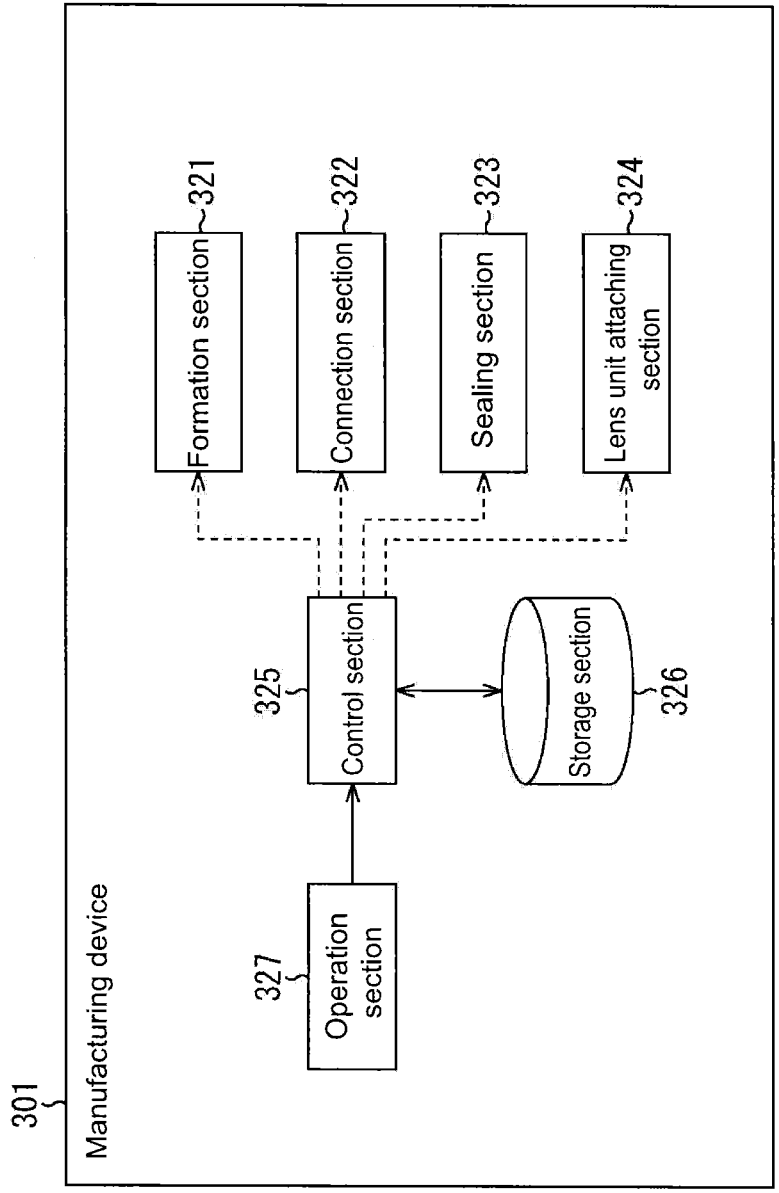
FIG. 17 is a block diagram showing an exemplary configuration of a manufacturing device that manufactures the camera module.

FIG. 17 shows an exemplary configuration of a manufacturing device 301 for manufacturing the camera module 41.

This manufacturing device 301 is configured to include a formation section 321, a connection section 322, a sealing section 323, a lens unit attaching section 324, a control section 325, a storage section 326, and an operation section 327. In FIG. 17, solid arrows each indicate a signal line, and dotted arrows each indicate a control line.

The formation section 321 forms the TSVs 22a to 22d to the imaging sensor 21. The formation section 321 also forms the soldering sections 21c to 21f on the underside of the imaging sensor 21, i.e., surface opposite to the surface including the light-receiving surface, for manufacturing the camera module 41 being reflowable.

The formation section 321 forms the through electrodes 62a to 62d to the transmissive member 62. More in detail, by sandblast or using a drill, the formation section 321 forms through holes to the transmissive member 62 where the through electrodes 62a to 62d are to be formed, for example. The resulting through holes are then each filled with a metal pin as a through electrode.

Alternatively, the formation section 321 may form the through electrodes to the through holes by performing a plating process into the through holes formed to the transmissive member 62 to fill the through holes with the metal of the plating, for example.

Using the bumps or others, the connection section 322 establishes electrical connections respectively between the TSVs 22a to 22d formed to the imaging sensor 21 and the through electrodes 62a to 62d formed to the transmissive member 62, thereby attaching the transmissive member 62 onto the imaging sensor 21.

For such connections between the TSVs 22a to 22d and the through electrodes 62a to 62d using the bumps or others, an adhesive such as NCF (Non Conductive Film) or an ACF (Anisotropic Conductive Film) may be used. When such an adhesive is used, portions for attachment are put under pressure and heated to connect together the TSVs 22a to 22d and the through electrodes 62a to 62d via the bumps, for example.

In such a case, the bumps are desirably each an Au Bump (bump made of copper) that is easily excluded during pressure application of the adhesive.

Alternatively, the TSVs 22a to 22d and the through electrodes 62a to 62d may be attached together not via the bumps or others but directly using the adhesive such as NCF or ACF.

Also using the bumps or others, the connection section 322 establishes electrical connections respectively between the through electrodes 62a to 62d and the sheet-like electrodes of the actuators 64a to 64d. As an example, similarly to the connections between the TSVs 22a to 22d and the through electrodes 62a to 62d, the connection section 322 connects together the through electrodes 62a to 62d and the sheet-like electrodes of the actuators 64a to 64d, for example.

Using the sealing member, the sealing section 323 seals the bumps or others used for the connections between the TSVs 22a to 22d and the through electrodes 62a to 62d. As a result, the imaging sensor 21 is formed thereon with the sealing member 61b, for example.

The sealing section 323 also seals, using the sealing member, the bumps or others used for the connections between the through electrodes 62a to 62d and the sheet-like electrodes of the actuators 64a to 64d. As a result, the imaging sensor 21 is formed thereon with the sealing member 63b, for example.

The lens unit attaching section 324 attaches the actuators 64a to 64d to the lens unit 65.

The control section 325 is configured by a CPU (central processing unit), for example, and exerts control over the other components, i.e., the formation section 321, the connection section 322, the sealing section 323, and the lens unit attaching section 324, in accordance with an operation signal coming from the operation section 327.

The storage section 326 is a hard disk, for example, and stores in advance a control program to be run by the control section 325. The storage section 326 performs writing (storage) of data instructed for writing by the control section 325, and performs reading of data instructed thereby for reading. Note here that the control program may be updated over a network such as the Internet, or may be updated using a storage medium including a new control program, for example.

The operation section 327 is configured by buttons or others for operation by an operator. The operation section 327 is operated by the operator, and supplies an operation signal corresponding to the operation to the control section 325. As an example, when the operator uses the operation section 327 to make a user operation or others for instructing the manufacturing of the camera module 41, in response thereto, the manufacturing device 301 starts manufacturing the camera module 41.

[Manufacturing Method for Camera Module 41]

By referring to the flowchart of FIG. 18, described next is a manufacturing method for manufacturing the camera module 41 of FIGS. 2 to 10.

This manufacturing process is started when an operator uses the operation section 327 of the manufacturing device 301 to perform an instruction operation to instruct the manufacturing of the camera module 41, for example. At this time, the operation section 327 supplies an operation signal corresponding to the operator's instruction operation to the control section 325. Based on the operation signal provided by the operation section 327 as such, the control section 325 exerts control over the other components, i.e., the formation section 321, the connection section 322, the sealing section 323, and the lens unit attaching section 324, for manufacturing of the camera module 41.

To be more specific, in step S1, the formation section 321 forms the TSVs 22a to 22d to the imaging sensor 21. The formation section 321 also forms the soldering sections 21c to 21f to the underside of the imaging sensor 21 (the surface opposite to the surface including the light-receiving surface) for manufacturing the camera module 41 being reflowable.

In step S2, the formation section 321 forms the through electrodes 62a to 62d to the transmissive member 62.

In step S3, using the bumps or others, the connection section 322 electrically connects, respectively, the TSVs 22a to 22d formed to the imaging sensor 21 and the through electrodes 62a to 62d formed to the transmissive member 62, thereby attaching the transmissive member 62 onto the imaging sensor 21.

In step S4, using the sealing member, the sealing section 323 seals the bumps or others used for the connections between the TSVs 22a to 22d and the through electrodes 62a to 62d. As a result, the imaging sensor 21 is formed thereon with the sealing member 61b, for example.

In step S5, using the bumps or others, the connection section 322 connects together the through electrodes 62a to 62d and the sheet-like electrodes of the actuators 64a to 64d, respectively.

In step S6, the sealing section 323 also seals, using the sealing member, the bumps or others used for the connections between the through electrodes 62a to 62d and the sheet-like electrodes of the actuators 64a to 64d, respectively. As a result, the transmissive member 62 is formed thereon with the sealing member 63b, for example.

In step S7, the lens unit attaching section 324 attaches the actuators 64a to 64d to the lens unit 65. This is the end of the manufacturing process.

Note that, with the configuration not including the transmissive member 62, the procedure skips the process of step S2, and in step S3, the connection section 322 connects, using the bumps or others, the TSVs 22*a* to 22*d* formed to the imaging sensor 21 and the sheet-like electrodes of the actuators 64*a* to 64*d*, respectively.

Thereafter, in step S4, using the sealing member, the sealing section 323 seals the bumps or others used for the connections among the TSVs 22*a* to 22*d*, the sheet-like electrodes of the actuators 64*a* to 64*d*, and the through electrodes 62*a* to 62*d*, respectively.

Thereafter, the procedure skips the processes of steps S5 and S6, and in step S7, the lens unit attaching section 324 attaches the actuators 64*a* to 64*d* to the lens unit 65.

The present disclosure is also in the following structures.

(1) A camera module, including:

an imaging sensor including a light-receiving surface, the light-receiving surface receiving light gathered by a lens;

a power feed electrode formed to a surface including the light receiving-surface of the imaging sensor, the power feed electrode being configured to make a power feed;

a first conductive member configured to electrically connect the power feed electrode and a drive electrode, the drive electrode being provided to a drive section configured to drive the lens in accordance with the power feed; and a first sealing member formed by sealing the first conductive member.

(2) The camera module according to (1), further including a transmissive member provided on the imaging sensor to cover the light-receiving surface, in which the first conductive member is configured to go through the transmissive member to electrically connect together the power feed electrode and the drive electrode.

(3) The camera module according to (1) or (2), further including a second conductive member provided on a rear surface of the surface including the light-receiving surface of the imaging sensor, in which the power feed electrode is electrically connected also to the second conductive member by going through the imaging sensor.

(4) The camera module according to (1) or (2), further including a through electrode formed to go through the drive section, the through electrode being connected to the drive electrode, in which the first conductive member connects together the power feed electrode and the drive electrode via the through electrode.

(5) A manufacturing device, including:

a formation section configured to form a power feed electrode to a surface including a light-receiving surface of an imaging sensor for a power feed, the light-receiving surface receiving light gathered by a lens;

a connection section configured to connect, by a first conductive member, the power feed electrode and a drive electrode, the drive electrode being provided to a drive section configured to drive the lens in accordance with the power feed; and a sealing section configured to seal the first conductive member.

(6) A manufacturing method for a manufacturing device that manufactures a camera module, including, for execution by the manufacturing device:

forming a power feed electrode to a surface including a light-receiving surface of an imaging sensor for a power feed, the light-receiving surface receiving light gathered by a lens;

connecting, by a first conductive member, the power feed electrode and a drive electrode, the drive electrode being provided to a drive section configured to drive the lens in accordance with the power feed; and sealing the first conductive member.

It should be noted herein that the steps for describing a series of steps above include not only the processes to be executed sequentially in the described order but also the processes to be executed not necessarily sequentially but concurrently or discretely.

While the present disclosure has been described in detail, the foregoing description is in all aspects illustrative and not restrictive. It is understood that numerous other modifications and variations are to be devised without departing from the gist of the present disclosure.

The present disclosure contains subject matter related to that disclosed in Japanese Priority Patent Application JP 2011-168024 filed in the Japan Patent Office on Aug. 1, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A camera module, comprising:

an imaging sensor including a light-receiving surface, the light-receiving surface receiving light gathered by a lens;

a power feed electrode formed to a surface including the light receiving-surface of the imaging sensor, the power feed electrode being configured to make a power feed;

a first conductive member configured to electrically connect the power feed electrode and a drive electrode, the drive electrode being provided to a drive section configured to drive the lens in accordance with the power feed; and a first sealing member formed by sealing the first conductive member.

2. The camera module according to claim 1, further comprising a transmissive member provided on the imaging sensor to cover the light-receiving surface, wherein the first conductive member is configured to go through the transmissive member to electrically connect together the power feed electrode and the drive electrode.

3. The camera module according to claim 1, further comprising a second conductive member provided on a rear surface of the surface including the light-receiving surface of the imaging sensor, wherein the power feed electrode is electrically connected also to the second conductive member by going through the imaging sensor.

4. The camera module according to claim 1, further comprising a through electrode formed to go through the drive section, the through electrode being connected to the drive electrode, wherein the first conductive member connects together the power feed electrode and the drive electrode via the through electrode.

5. A manufacturing device, comprising:

a formation section configured to form a power feed electrode to a surface including a light-receiving surface of an imaging sensor for a power feed, the light-receiving surface receiving light gathered by a lens;

a connection section configured to connect, by a first conductive member, the power feed electrode and a drive electrode, the drive electrode being provided to a drive section configured to drive the lens in accordance with the power feed; and a sealing section configured to seal the first conductive member.

6. A manufacturing method for a manufacturing device that manufactures a camera module, comprising, for execution by the manufacturing device:

forming a power feed electrode to a surface including a light-receiving surface of an imaging sensor for a power feed, the light-receiving surface receiving light gathered by a lens;

connecting, by a first conductive member, the power feed electrode and a drive electrode, the drive electrode being provided to a drive section configured to drive the lens in accordance with the power feed; and sealing the first conductive member.

* * * * *